United States Patent
Hirose et al.

(10) Patent No.: US 7,914,894 B2
(45) Date of Patent: Mar. 29, 2011

(54) FLEXIBLE, HIGH PURITY EXPANDED GRAPHITE SHEET, METHOD OF PRODUCING SAME, AND CARBON CRUCIBLE LINING USING SAID SHEET

(75) Inventors: Yoshiaki Hirose, Kan-onji (JP); Hideki Inomoto, Kan-onji (JP)

(73) Assignee: Toyo Tanso Co., Ltd, Osaka (JP)

( * ) Notice: Subject to any disclaimer, the term of this patent is extended or adjusted under 35 U.S.C. 154(b) by 0 days.

(21) Appl. No.: 11/124,240

(22) Filed: May 9, 2005

(65) Prior Publication Data

US 2005/0196613 A1 Sep. 8, 2005

Related U.S. Application Data

(62) Division of application No. 10/462,663, filed on Jun. 17, 2003, now abandoned.

(30) Foreign Application Priority Data

Jun. 18, 2002 (JP) .................................. 2002-214564

(51) Int. Cl.
*B32B 9/00* (2006.01)
(52) U.S. Cl. ...................................... 428/408; 423/447.1
(58) Field of Classification Search .................. 428/408; 427/577, 122; 501/95.1, 99; 423/445 R, 423/447.1
See application file for complete search history.

(56) References Cited

U.S. PATENT DOCUMENTS

| | | | |
|---|---|---|---|
| 3,655,354 A * | 4/1972 | Quandt ............................. | 65/24 |
| 4,190,257 A * | 2/1980 | Schnitzler ...................... | 277/539 |
| 4,294,438 A * | 10/1981 | Nystrom et al. .............. | 266/280 |
| 4,888,242 A | 12/1989 | Matsuo et al. | |
| 5,288,366 A * | 2/1994 | Holder ............................. | 117/33 |
| 5,414,927 A * | 5/1995 | Fiel et al. ......................... | 29/825 |
| 6,027,809 A | 2/2000 | Ueda et al. | |
| 6,133,178 A * | 10/2000 | Yamada et al. ................. | 501/54 |
| 2005/0196613 A1 | 9/2005 | Hirose et al. | |

FOREIGN PATENT DOCUMENTS

| | | |
|---|---|---|
| JP | 63-156091 | 6/1988 |
| JP | 04-021509 | 1/1992 |
| JP | 2620606 | 4/1997 |
| JP | 10-025172 | 1/1998 |
| JP | 10-245214 | 9/1998 |

OTHER PUBLICATIONS

Nobuatsu Watanabe; "Graphite Intercalation Compounds"; Published by Kindai Henshusya Co. Ltd., Sep. 1, 1986; Japan; pp. 328-330.
U.S. Appl. No. 12/478,792, filed Jun. 5, 2009, Hirose, et al.

* cited by examiner

*Primary Examiner* — Angela Ortiz
*Assistant Examiner* — Daniel Miller
(74) *Attorney, Agent, or Firm* — Oblon, Spivak, McClelland, Maier & Neustadt, L.L.P.

(57) ABSTRACT

The invention provides a flexible, highly pure expanded graphite sheet characterized by having an impurity content of 10 ppm or less and such a degree of flexibility that a sample thereof, 10×100 mm in size can withstand at least 10 times of bending in flexibility test comprising repeatedly bending the sample, with a 50-g weight suspended from one end thereof, by means of bending bodies with a diameter of 6 mm.

10 Claims, 3 Drawing Sheets

US 7,914,894 B2

FLEXIBLE, HIGH PURITY EXPANDED GRAPHITE SHEET, METHOD OF PRODUCING SAME, AND CARBON CRUCIBLE LINING USING SAID SHEET

CROSS-REFERENCE TO RELATED APPLICATIONS

This application is based upon and claims the benefit of priority under 35 U.S.C. §120 of U.S. application Ser. No. 10/462,663 filed on Jun. 17, 2003, and under 35 U.S.C. §119 of Japanese application no. 2002-214564 filed on Jun. 18, 2002, the entire contents of both of which are incorporated herein by reference.

BACKGROUND OF THE INVENTION

1. Field of the Invention

The present invention relates to a flexible, high-purity expanded graphite sheet, and to a method of producing the same.

2. Description of the Prior Art

Expanded graphite sheets are generally produced by treating natural graphite, pyrolytic graphite, kish graphite or the like with a mixed solution containing sulfuric acid and nitric acid, for instance, then washing the same with water, drying the same, treating the same for expansion in an expansion oven at about 1,000° C., and forming the same into sheets using a rolling machine, for instance. Expanded graphite sheets are excellent in heat resistance and in gas and liquid impermeability and therefore are used as packing materials, valve sheets, gaskets, and fuel cell separators, among others.

Japanese Patent No. 2,620,606 discloses that highly pure expanded graphite sheets having an impurity content of not more than 15 ppm can be obtained by treating such expanded graphite sheets for increased purity in a halogen gas atmosphere at 2,000° C. or above. Such sheets are used in the process of semiconductor production.

Hereinafter, a detailed description is given of a high-purity expanded graphite sheet for use in semiconductor production, which is taken as an example. Such a high-purity expanded graphite sheet is also used in the Czochralski (hereinafter referred to as "CZ" for short) process, which is a representative single crystal pulling technique. A sectional view of the main parts of a CZ apparatus is shown in FIG. 1. The CZ apparatus comprises such parts as a carbon crucible 5 supporting a quartz crucible 1, a heater 2, an upper ring 6, and an inner shield 7, among others. In the CZ apparatus, polycrystalline silicon placed in the quartz crucible 1 is heated to a high temperature to give a silicon melt 3, and the tip of a seed crystal held by a seed chuck is brought into contact with the raw material melt 3 and then pulled up while maintaining the contact to thereby pull up a silicon single crystal 4.

As shown in FIG. 1, the carbon crucible 5 made of graphite or a carbon fiber-reinforced carbon composite material (such crucible is hereinafter referred to as "carbon crucible") is in direct contact with the quartz crucible 1 and, therefore, the surface of the carbon crucible 5 is gradually converted to silicon carbide thereinafter referred to as "SiC") as a result of the reaction between the quartz crucible 1 and carbon crucible 5 and/or the reaction between vaporized silicon and the graphite crucible. The difference in coefficient of thermal expansion between carbon and SiC is conducive to cracking of the carbon crucible, for instance. Furthermore, the quart crucible 1 becomes firmly sticking to the carbon crucible 5, making it difficult to take out the quartz crucible 1.

Japanese Patent No. 2,528,285 discloses, as a means for solving such problems, the use of a high-purity expanded graphite sheet as a liner intervening between the quartz crucible 1 and carbon crucible 5.

When an expanded graphite sheet is treated for improving the purity thereof, the flexibility of the expanded graphite sheet is generally impaired, so that it can no loner be used as a member which is required to have flexibility. Therefore, Japanese Patent No. 2,620,606 discloses a method of restoring flexibility which comprises compression molding. However, the method has other problems; the purity of the high-purity expanded graphite sheet is decreased upon compression molding and, when a complicated shape is given to the high-purity expanded graphite sheet insufficient in flexibility restoration by working with a cutter, for instance, the peripheral parts of the sheet are subject to cracking and/or chipping.

When the whole inside surface of the carbon crucible is covered with an expanded graphite sheet, the efficiency of heating of the quartz crucible 1 decreases. Therefore, in recent years, various complicated liner shapes have been proposed so that the quartz crucible heating efficiency may be improved. Basically, each single crystal production operation consumes one intervening liner and, therefore, it is important to provide a method of producing high-purity expanded graphite sheets which is excellent in mass productivity.

Accordingly, it is an object of the present invention to provide a high-purity expanded graphite sheet having flexibility and a method of producing the same. Another object of the invention is to provide a method of manufacturing expanded graphite sheets which is suited for mass production as well.

SUMMARY OF THE INVENTION

The present inventors made intensive investigations in an attempt to accomplish the above objects and, as a result, found that when an expanded graphite sheet whose bulk density is within a certain specific range is treated for attaining high purity, a high-purity expanded graphite sheet can be obtained without deterioration in flexibility even after the treatment for attaining high purity. This and other findings have now led to completion of the present invention. Thus, in a first aspect, a high-purity expanded graphite sheet characterized in that it has an impurity content not exceeding 10 ppm and has such a degree of flexibility that a sample thereof can withstand at least 10 times of bending on a testing apparatus such as shown in FIG. 4 is provided. In a second aspect, a flexible, high-purity expanded graphite sheet which has the above characteristics and is further characterized by its bulk density being 0.5 to 1.3 g/cm$^3$ is provided. In a third aspect, a flexible, high-purity expanded graphite sheet as defined in aspects 1 or 2 which is further characterized by its thickness being 0.2 to 1.0 mm is provided.

For obtaining the flexible, high-purity expanded graphite sheet according to aspect 1, it is necessary to use scaly graphite, kish graphite, pyrolytic graphite or the like as a filler, subject this to oxidation treatment by immersing the same in a mixed acid supplemented with concentrated sulfuric acid, concentrated nitric acid, etc., wash the immersed filler with water and, after drying, treat the same for expansion by heating to give expanded graphite, and adjust the bulk density thereof to about 0.7 to 1.3 g/cm$^3$ by compression molding using a press or rolling machine. Expanded graphite sheets having a bulk density lower than 0.7 g/cm$^3$ cannot acquire, even after purification treatment, such a degree of flexibility as to withstand at least 10 times of bending, hence are unfavorable. Expanded graphite sheets having a bulk density exceeding 1.3 g/cm³ are also undesirable, since the impurity content therein cannot be reduced to 10 ppm or below even by purification treatment. In a preferred embodiment of the invention, expanded graphite sheets with a bulk density adjusted to 0.8 to 1.3 g/cm³, more preferably to 0.9 to 1.3 g/cm³, are subjected to treatment for attaining high purity. The method of purification treatment itself may be any of those known in the art. For example, flexible, high-purity expanded graphite sheets having an impurity content of not more than 10 ppm and a degree of flexibility as to withstand at least 10 times of bending can be obtained by heating expanded graphite sheets at 2,000° C. or above in a halogen gas atmosphere to thereby convert metals in the sheets to metal halide compounds showing a high vapor pressure and allow them to vaporize. The bulk density and sheet thickness of expanded graphite sheets after purification treatment show little changes and remain almost equal to those before treatment. A flexibility measuring apparatus is schematically shown in FIG. 3. A 50-g weight 22 is attached to one end of a 10 mm×100 mm sample 21 of a high-purity expanded graphite sheet and subjected to repeated bending by means of bending bodies 24 with a diameter of 6 mm. The number of times of bending until breakage is counted and recorded as the flexibility in the longitudinal direction.

In a fourth aspect, a method of producing flexible, high-purity expanded graphite sheets which includes forming an expanded graphite sheet having a bulk density of 0.7 to 1.3 g/cm³ into a desired shape and then subjecting the shaped sheet to purification treatment is provided. Expanded graphite sheets having a bulk density less than 0.7 g/cm³ are undesirable since any purification treatment cannot improve their flexibility to a level of at least 10 times, as mentioned above. Expanded graphite sheets having a bulk density exceeding 1.3 g/cm³ are also unfavorable since their impurity content cannot be reduced to 10 ppm or less by purification treatment. Preferably, the expanded graphite sheet to be treated for purification has a thickness of 0.2 to 1.0 mm. When the expanded graphite sheet before purification treatment is less than 0.2 mm in thickness, the sheet after purification treatment tends to show marked decreases in flexibility and strength, hence are susceptible to cracking, for instance. When the expanded graphite sheet is thicker than 1.0 mm, the impurity content cannot be reduced to a satisfactory extent by purification treatment. More preferably, the expanded graphite sheet to be subjected to purification treatment has a thickness of 0.3 to 0.9 mm. Most preferably, 0.5 to 0.8-mm-thick expanded graphite sheets are subjected to purification treatment. As the "desired shape" so referred to herein, there may be mentioned, for example, the shape shown in FIG. 2 or FIG. 3 and, further, figures of line symmetry, such as ellipses, stars and the Imperial crest of chrysanthemum, and asymmetric figures.

In a fifth aspect, a modification of the method specified above which modification comprises includes forming a plurality of expanded graphite sheets each into one and the same desired shape simultaneously in a laminate form, followed by purification treatment is provided. This modification is preferred since the mass productivity in manufacturing expanded graphite sheets having one and the same desired, complicated shape can be improved by laying a plurality of expanded graphite sheets one upon another and working them simultaneously in one operation according to the method mentioned above. Preferably, a plurality of expanded graphite sheets each having a thickness of 0.2 to 1.0 mm are laid one upon another. When each expanded graphite sheet is less than 0.2 mm in thickness, the expanded graphite sheet cannot acquire flexibility or strength but becomes susceptible to cracking, for instance. When each sheet is thicker than 1.0 mm, the impurity content cannot be reduced to a satisfactory extent by purification treatment; this is unfavorable. It is desirable that the bulk density of expanded graphite sheets prior to purification treatment be 0.7 to 1.3 g/cm³.

In a sixth aspect, a method of producing such expanded graphite sheets as mentioned above in which the shaping of expanded graphite sheets is carried out by at least one method selected from among such methods as slitting, punching using a Thomson die, water jet working, and laser working is provided. From the mass productivity viewpoint, however, punching with a Thomson die and water jet working are preferred since they can reduce the working time, are less likely to decrease the purity of expanded graphite sheets and, further, are excellent in mass productivity. It is to be added that when expanded graphite sheets are shaped by punching using a Thomson die, the purification treatment should preferably be carried out after removing working dust from the worked surface (cut surface) by ultrasonic cleaning in a state immersed in water, alcohol or the like and the subsequent drying for evaporation of the moisture.

In a seventh aspect, the use of the flexible, high-purity expanded graphite sheet as defined in any one of aspects 1 to 3 as a carbon crucible liner is provided. When such a high-purity expanded graphite sheet having flexibility and a low impurity content is used as a carbon crucible liner, the stability of the quartz crucible is good and the intrusion of silicon monoxide gas can be prevented, so that the carbon crucible can be inhibited from being converted to silicon carbide and the life of the expensive carbon crucible can be prolonged.

BRIEF DESCRIPTION OF THE DRAWINGS

In FIGS. 1 and 4, the numerical symbols respectively denote the following: 1—quartz crucible, 2—heater, 3—silicon melt, 4—silicon single crystal, 5—carbon crucible, 6—upper ring, 7—inner shield, 8—lower ring, 9—bottom heater, 10—heat insulator, 11—spill tray, 21—sample (of high-purity expanded graphite sheet), 22—weight, 23—directions of bending, 24—benders

DETAILED DESCRIPTION OF THE PREFERRED EMBODIMENTS

The following examples illustrate the present invention more specifically. These examples are, however, by no means limitative of the scope of the present invention.

Example 1

Figure 1:
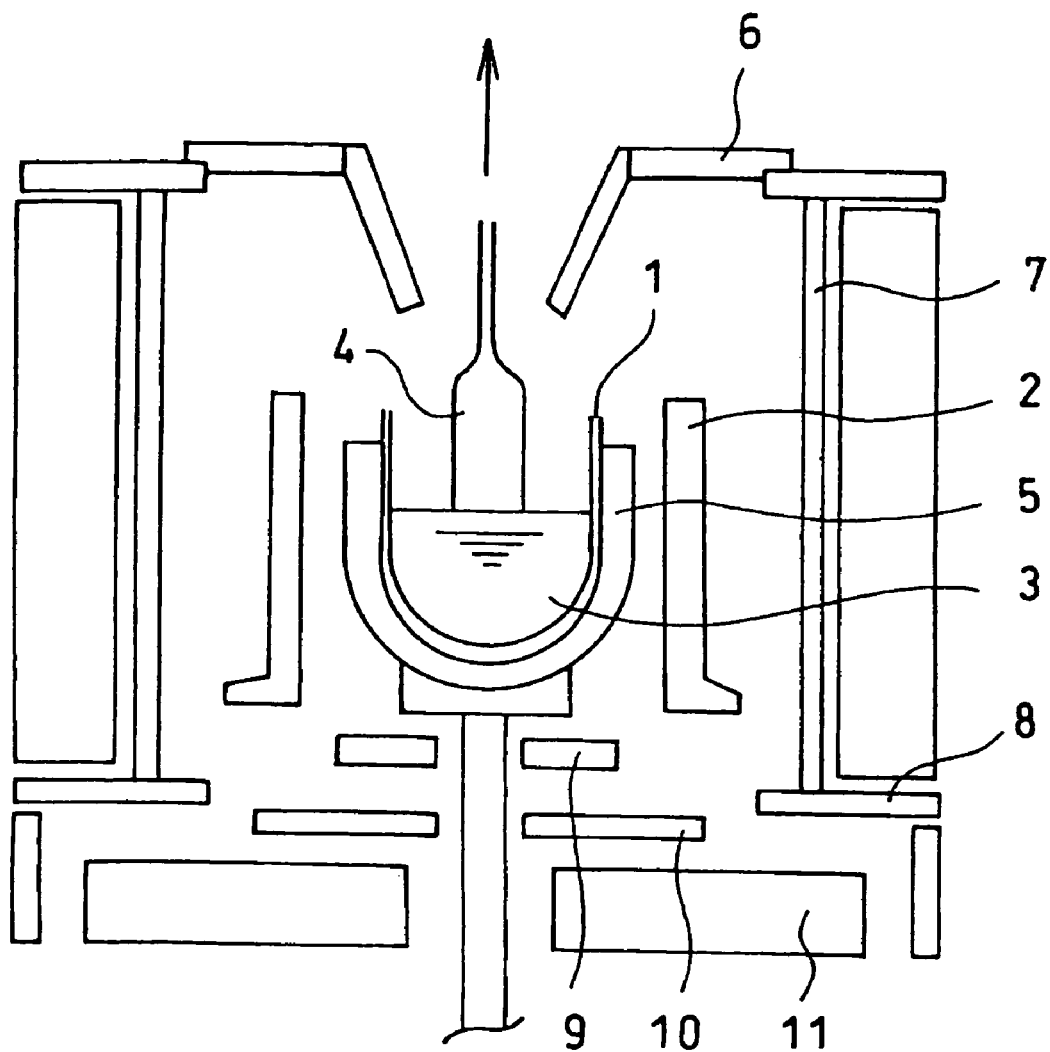
FIG. 1 is a schematic sectional view of a single crystal puller.
Figure 2:
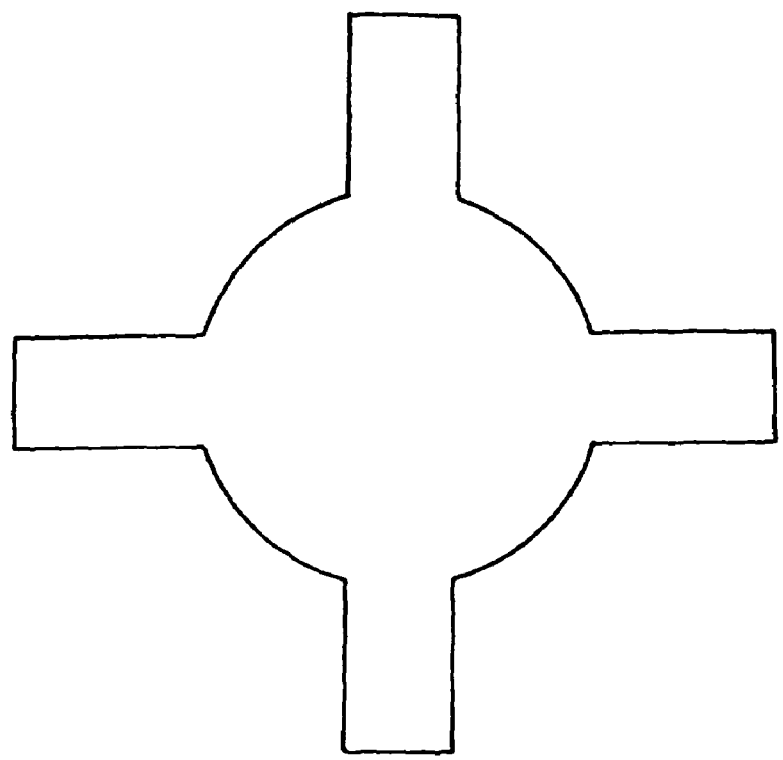
FIG. 2 is an illustration of shaping of a high-purity expanded graphite sheet suited for use as an intervening liner in a single crystal pulling apparatus.
Figure 3:
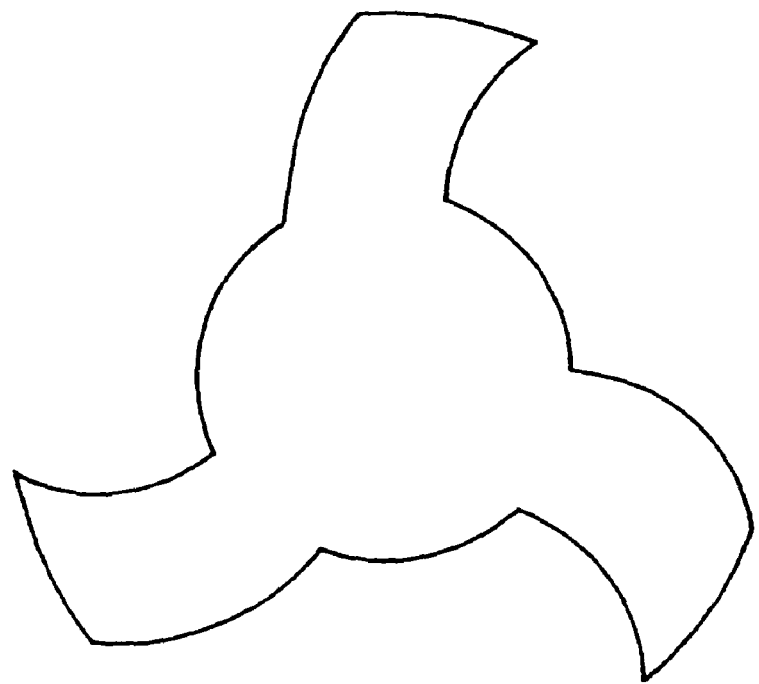
FIG. 3 is an illustration of shaping of another high-purity expanded graphite sheet suited for use as a liner in a single crystal puller.
Figure 4:
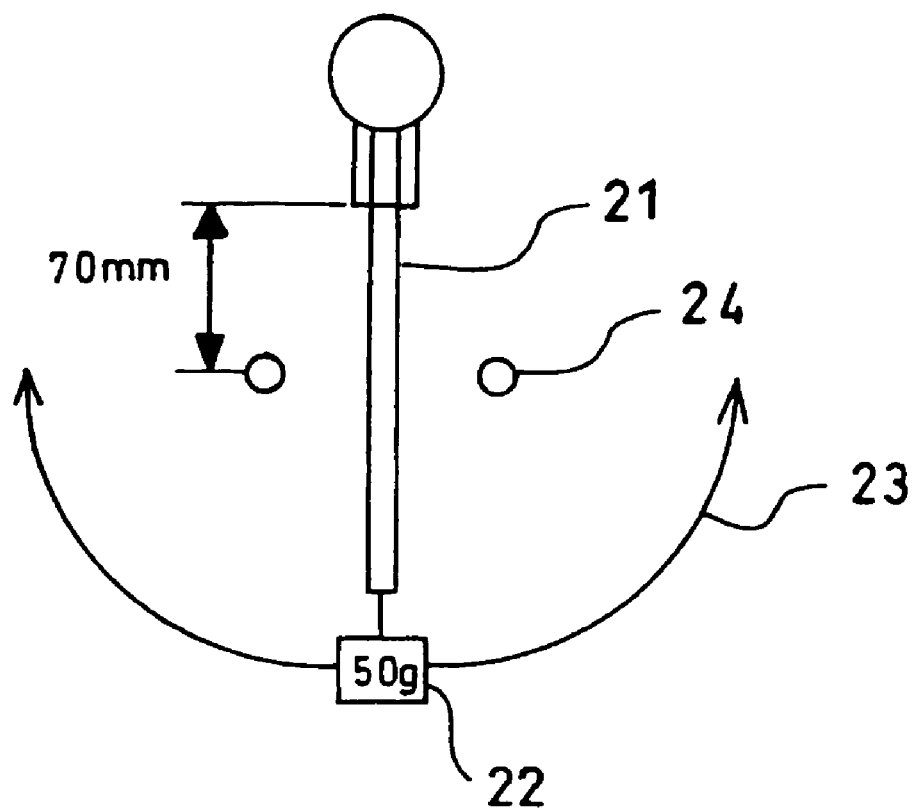
FIG. 4 is a schematic representation of a flexibility measuring apparatus.

An expanded graphite sheet made by Toyo Tanso Co. Ltd. (grade name: PF-50, size: 1,000×1,000×0.5 (mm), bulk density: 1.3 g/cm³, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,000° C. for 10 hours while gaseous chlorine was fed.

Example 2

A laminate was prepared by laying, one upon another, 10 expanded graphite sheets made of the same material and having the same size as the sheet used in Example 1. This laminate was formed into the shape shown in FIG. 2 by punching using a hydraulic press and a Thomson die at a pressure of 50 MPa. The shaped article was then treated for purification; thus, it was maintained at 2,000° C. for 10 hours while gaseous chlorine was fed.

Example 3

An expanded graphite sheet made by Toyo Tanso Co. Ltd. (grade name: PF-40, thickness: 0.4 mm, bulk duty: 1.0 g/cm$^3$, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,000° C. for 10 hours while gaseous chlorine was fed.

Example 4

A laminate was prepared by laying, one upon another, 10 expanded graphite sheets made of the same material and having the same size as the sheet used in Example 3. This laminate was formed into the shape shown in FIG. 2 by punching using a hydraulic press and a Thomson die at a pressure of 50 MPa. The shaped article was then treated for purification; thus, it was maintained at 2,000° C. for 10 hours while gaseous chlorine was fed.

Example 5

An expanded graphite sheet made by Toyo Tanso Co. Ltd. (grade name: PF-40, thickness: 0.4 mm, bulk density: 0.7 g/cm$^3$, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,000° C. for 10 hours while gaseous chlorine was fed.

Example 6

A laminate was prepared by laying, one upon another, 10 expanded graphite sheets made of the same material and having the same size as the sheet used in Example 5. This laminate was formed into the shape shown in FIG. 2 by punching using a hydraulic press and a Thomson die at a pressure of 50 MPa. The shaped article was then treated for purification; thus, it was maintained at 2,000° C. for 10 hours while gaseous chlorine was fed.

Example 7

An expanded graphite sheet made of the same material and having the same size as that used in Example 1 was obtained. This sheet was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Example 8

A laminate was prepared by laying, one upon another, 10 expanded graphite sheets made of the same material and having the same size as the sheet used in Example 1. This laminate was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Example 9

An expanded graphite sheet made by Toyo Tanso Co. Ltd (grade name: PF-40, thickness: 0.4 mm, bulk density: 1.0 g/cm$^3$, ash content: 0.2% by mass) was obtained This sheet was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Example 10

A laminate was prepared by laying, one upon another, 10 expanded graphite sheets made of the same material and having the same size as the sheet used in Example 3. This laminate was formed into the shape shown in FIG. 2 by subjecting to water jet working using a nozzle having an orifice diameter of 0.1 mm at a water pressure of 8,000 kg/cm$^2$. The shaped article was then treated for purification; thus, it was heated to and maintained at 2,000° C. for 10 hours while gaseous chlorine was fed.

Example 11

An expanded graphite sheet made by Toyo Tanso Co. Ltd. (grade name: PF-40, thickness: 0.4 mm, bulk density: 0.7 g/cm$^3$, ash content: 0.2% by mass) was obtained This sheet was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Example 12

A laminate was prepared by laying, one upon another, 10 expanded graphite sheets made of the same material and having the same size as the sheet used in Example 5. This laminate was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Example 13

An expanded graphite sheet made by Toyo Tanso Co. Ltd. (grade name: PF-20, size: 1,000×1,000×0.2 (mm), bulk density: 1.3 g/cm$^3$, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,000° C. for 10 hours while gaseous chlorine was fed.

Example 14

A laminate was prepared by laying, one upon another, 10 expanded graphite sheets made of the same material and having the same size as the sheet used in Example 13. This laminate was formed into the shape shown in FIG. 2 by punching using a hydraulic press and a Thomson die at a pressure of 50 MPa. The shaped article was then treated for purification; thus, it was maintained at 2,000° C. for 10 hours while gaseous chlorine was fed.

Example 15

An expanded graphite sheet made by Toyo Tanso Co. Ltd. (grade name: PF-20, thickness: 0.2 mm, bulk density: 1.0 g/cm$^3$, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,000° C. for 10 hours while gaseous chlorine was fed.

Example 16

A laminate was prepared by laying, one upon another, 10 expanded graphite sheets made of the same material and having the same size as the sheet used in Example 15. This laminate was formed into the shape shown in FIG. 2 by punching using a hydraulic press and a Thomson die at a pressure of 50 MPa. The shaped article was then treated for purification; thus, it was maintained at 2,0000° C. for 10 hours while gaseous chlorine was fed.

Example 17

An expanded graphite sheet made by Toyo Tanso Co. Ltd. (grade name: PF-20, thickness: 0.2 mm, bulk density: 0.7 g/cm$^3$, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,0000° C. for 10 hours while gaseous chlorine was fed.

Example 18

A laminate was prepared by laying, one upon another, 10 expanded graphite sheets made of the same material and having the same size as the sheet used in Example 17. This laminate was formed into the shape shown in FIG. 2 by punching using a hydraulic press and a Thomson die at a pressure of 50 MPa. The shaped article was then treated for purification; thus, it was maintained at 2,0000° C. for 10 hours while gaseous chlorine was fed.

Example 19

An expanded graphite sheet made by Toyo Tanso Co. Ltd. (grade name: PF-100, size: 1,000×1,000×1.0 (mm), bulk density: 1.3 g/cm$^3$, ash content: 0.2% by mass) was obtained. This sheet was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Example 20

A laminate was prepared by laying, one upon another, 10 expanded graphite sheets made of the same material and having the same size as the sheet used in Example 19. This laminate was formed into the shape shown in FIG. 2 by subjecting to water jet working using a nozzle having an orifice diameter of 0.1 mm at a water pressure of 3,000 kg/cm$^2$. The shaped article was then treated for purification; thus, it was heated to and maintained at 2,000° C. for 10 hours while gaseous chlorine was fed.

Example 21

An expanded graphite sheet made by Toyo Tanso Co. Ltd. (grade name: PF-100, thickness; 1.0 mm, bulk density: 1.0 g/cm$^3$, ash content: 0.2% by mass) was obtained. This sheet was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Example 22

A laminate was prepared by laying, one upon another, 10 expanded graphite sheets made of the same material and having the same size as the sheet used in Example 21. This laminate was formed into the shape shown in FIG. 2 by subjecting to water jet working using a nozzle having an orifice diameter of 0.1 mm at a water pressure of 3,000 kg/cm$^2$. The shaped article was then treated for purification; thus, it was heated to and maintained at 2,000° C. for 10 hours while gaseous chlorine was fed.

Example 23

An expanded graphite sheet made by Toyo Tanso Co. Ltd. (grade name: PF-100, thickness: 1.0 mm, bulk density: 0.7 g/cm$^3$, ash content: 0.2% by mass) was obtained This sheet was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Example 24

A laminate was prepared by laying, one upon another, 10 expanded graphite sheets made of the same material and having the same size as the sheet used in Example 23. This laminate was formed into the shape shown in FIG. 2 by subjecting to water jet working using a nozzle having an orifice diameter of 0.1 mm at a water pressure of 3,000 kg/cm$^2$. The shaped article was then treated for purification; thus, it was heated to and maintained at 2,000° C. for 10 hours while gaseous chlorine was fed.

Example 25

A laminate was prepared by laying, one upon another, 5 expanded graphite sheets made of the same material and having the same size as the sheet used in Example 1. This laminate was formed into the shape shown in FIG. 2 by subjecting to water jet working using a nozzle having an orifice diameter of 0.1 mm at a water pressure of 3,000 kg/cm$^2$. The time required for the shaping was 5 minutes. The shaped article was subjected to 3 minutes of ultrasonic cleaning at 43 kHz to thereby remove cut dust derived from the expanded graphite laminate. Then, the shaped article was dried at 100° C. for 30 minutes to evaporate the moisture and then treated for purification; thus, it was maintained at 2,000° C. for 10 hours while gaseous chlorine was fed.

Comparative Example 1

An expanded graphite sheet made by Toyo Tanso Co. Ltd (grade name: PF-50, size: 1,000×1,000×0.5 (mm), bulk density: 1.5 g/cm$^3$, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,000° C. for 10 hours while gaseous chlorine was fed.

Comparative Example 2

A laminate was prepared by laying, one upon another, 10 expanded graphite sheets made of the same material and having the same size as the sheet used in Comparative Example 1. This laminate was formed into the shape shown in FIG. 2 by punching using a hydraulic press and a Thomson die at a pressure of 50 MPa. The shaped article was then treated for purification; thus, it was maintained at 2,000° C. for 10 hours while gaseous chlorine was fed.

Comparative Example 3

An expanded graphite sheet made by Toyo Tanso Co. Ltd. (grade name: PF-10, size: 1,000×1,000×0.1 (mm), bulk density: 1.3 g/cm$^3$, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,000° C. for 10 hours while gaseous chlorine was fed.

Comparative Example 4

A laminate was prepared by laying, one upon another, 10 expanded graphite sheets made of the same material and having the same size as the sheet used in Comparative Example 3. This laminate was formed into the shape shown in FIG. 2 by punching using a hydraulic press and a Thomson die at a pressure of 50 MPa. The shaped article was then treated for purification; thus, it was maintained at 2,000° C. for 10 hours while gaseous chlorine was fed.

Comparative Example 5

An expanded graphite sheet made by Toyo Tanso Co. Ltd (grade name: PF-120, size: 1,000×1,000×1.2 (mm), bulk density: 1.3 g/cm$^3$, ash content: 0.2% by mass) was obtained. This sheet was formed into the shape shown in FIG. 2 by punching using a hydraulic press and a Thomson die at a pressure of 10 MPa. The shaped article was then treated for purification; thus, it was maintained at 2,000° C. for 10 hours while gaseous chlorine was fed.

Comparative Example 6

A laminate was prepared by laying, one upon another, 10 expanded graphite sheets made of the same material and having the same size as the sheet used in Comparative Example 5. This laminate was formed into the shape shown in FIG. 2 by punching using a hydraulic press and a Thomson die at a pressure of 50 MPa. The shaped article was then treated for purification; thus, it was maintained at 2,000° C. for 10 hours while gaseous chlorine was fed.

Comparative Example 7

A laminate was prepared by laying, one upon another, 5 expanded graphite sheets made of the same material and having the same size as the sheet used in Example 1. This laminate was formed into the shape shown in FIG. 2 by manual working using a cutter. The time required for the shaping was 1 hour. The shaped article was subjected to 3 minutes of ultrasonic cleaning at 43 kHz to thereby remove cut dust derived from the expanded graphite laminate. Then, the shaped article was dried at 100° C. for 30 minutes to evaporate the moisture and then treated for purification; thus, it was maintained at 2,000° C. for 10 hours while gaseous chlorine was fed.

Comparative Example 8

A laminate was prepared by laying, one upon another, 10 expanded graphite sheets made by Toyo Tanso Co. Ltd (grade name: PF-40, size: 1,000×1,000×0.4 (mm, bulk density: 0.6 g/cm$^3$, ash content: 0.2% by mass). This laminate was formed into the shape shown in FIG. 2 by subjecting to water jet working using a nozzle having an orifice diameter of 0.1 mm at a water pressure of 3,000 kg/cm$^3$. The shaped article was then treated for purification; thus, it was maintained at 2,000° C. for 10 hours while gaseous chlorine was fed.

Comparative Example 9

A laminate was prepared by laying, one upon another, 10 expanded graphite sheets made by Toyo Tanso Co. Ltd (grade name: PF-40, size: 1,000×1,000×0.4 (mm), bulk density: 0.3 g/cm$^3$, ash content: 0.2% by mass). This laminate was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Comparative Example 10

A laminate was prepared by laying, one upon another, 10 expanded graphite sheets made by Toyo Tanso Co. Ltd. (grade name: PF-40, size: 1,000×1,000×0.4 (mm), bulk density: 0.2 g/cm$^3$, ash content: 0.2% by mass). This laminate was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

Comparative Example 11

An expanded graphite sheet made by Toyo Tanso Co. Ltd. (grade name: PF-40, size: 1,000×1,000×0.4 (mm), bulk density: 0.6 g/cm$^3$, ash content: 0.2% by mass) was obtained. This sheet was formed into the shape shown in FIG. 2 by subjecting to water jet working using a nozzle having an orifice diameter of 0.1 mm at a water pressure of 3,000 kg/cm$^2$. The shaped article was then treated for purification; thus, it was maintained at 2,000° C. for 10 hours while gaseous chlorine was fed.

For each of Examples 1 to 25 and Comparative Examples 1 to 11, the bulk density of the expanded graphite sheet, the thickness per sheet, the number of sheets in the laminate, the method of shaping, the flexibility in the longitudinal direction, and the purity after purification treatment are summarized in Table 1. The expanded graphite sheets after purification treatment showed little changes in bulk density or in sheet thickness and thus were comparable in these respects to the sheets before purification treatment.

The impurity content of each expanded graphite sheet after purification treatment was determined by weighing at least 15 g of the high-purity expanded graphite sheet in a porcelain crucible, placing the crucible in an electric furnace, heating it at 850° C. for 48 hours, and calculating the impurity content from the mass before heating and the mass after heating.

As is evident from Table 1, those expanded graphite sheets having a bulk density of 0.7 to 1.3 g/cm$^3$ and a thickness of 0.2 to 1.0 mm per sheet showed only slight decreases in flexibility after purification treatment and could be prevented from decreasing in purity.

A silicon single crystal growth experiment was carried out using the high-purity expanded graphite sheet obtained in Example 25 and Comparative Example 3 each as an intervening liner in a CZ apparatus. When the liner produced in Example 25 was used, it was confirmed by the eye that the area of yellowed portions suggesting the formation of silicon carbide was smaller as compared with the case of the liner produced in Comparative Example 3. This resulted from cracking of the high-purity expanded graphite sheet of Comparative Example 3 due to lack of flexibility.

When a plurality of expanded graphite sheets having a bulk density of 0.7 to 1.3 g/cm$^3$ and a thickness of 0.2 to 1.0 mm per sheet are formed into a laminate and the laminate is worked into a desired shape, no impairment in flexibility is found after treatment for attaining high purity. In addition, when the laminate is shaped by water jet working, the working time can be reduced to $\frac{1}{10}$ or shorter as compared with that in the prior art and the impurity content can also be reduced to $\frac{1}{10}$ or below. Therefore, the products are useful in the semiconductor related industries as those carbon crucible liners for use in CZ apparatus, CVD ovens and the like which are required to have high purity and flexibility and, in the nuclear industry-related fields, as in-core or in-pile parts required to be flexible and highly pure.

TABLE 1

|  | Bulk density (g/cm$^3$) | Sheet thickness (mm/sheet) | Number of sheets in laminate | Shaping method | Flexibility (times) | Impurity content (ppm) |
|---|---|---|---|---|---|---|
| Example 1 | 1.3 | 0.5 | 1 | Thomson die | 12 | 4 |
| Example 2 | 1.3 | 0.5 | 10 | Thomson die | 12 | 4 |
| Example 3 | 1.0 | 0.4 | 1 | Thomson die | 10 | 3 |
| Example 4 | 1.0 | 0.4 | 10 | Thomson die | 10 | 3 |
| Example 5 | 0.7 | 0.4 | 1 | Thomson die | 10 | 2 |
| Example 6 | 0.7 | 0.4 | 10 | Thomson die | 10 | 2 |
| Example 7 | 1.3 | 0.5 | 1 | Water jet | 12 | 3 |
| Example 8 | 1.3 | 0.5 | 10 | Water jet | 12 | 3 |
| Example 9 | 1.0 | 0.4 | 1 | Water jet | 10 | 2 |
| Example 10 | 1.0 | 0.4 | 10 | Water jet | 10 | 2 |
| Example 11 | 0.7 | 0.4 | 1 | Water jet | 10 | 1 |
| Example 12 | 0.7 | 0.4 | 10 | Water jet | 10 | 1 |
| Example 13 | 1.3 | 0.2 | 1 | Thomson die | 20 | 3 |
| Example 14 | 1.3 | 0.2 | 10 | Thomson die | 20 | 3 |
| Example 15 | 1.0 | 0.2 | 1 | Thomson die | 18 | 2 |
| Example 16 | 1.0 | 0.2 | 10 | Thomson die | 18 | 2 |
| Example 17 | 0.7 | 0.2 | 1 | Thomson die | 10 | 1 |
| Example 18 | 0.7 | 0.2 | 10 | Thomson die | 10 | 1 |
| Example 19 | 1.3 | 1.0 | 1 | Water jet | 10 | 5 |
| Example 20 | 1.3 | 1.0 | 10 | Water jet | 10 | 5 |
| Example 21 | 1.0 | 1.0 | 1 | Water jet | 10 | 4 |
| Example 22 | 1.0 | 1.0 | 10 | Water jet | 10 | 4 |
| Example 23 | 0.7 | 1.0 | 1 | Water jet | 10 | 2 |
| Example 24 | 0.7 | 1.0 | 10 | Water jet | 10 | 2 |
| Example 25 | 1.3 | 0.5 | 5 | Water jet | 12 | 1 |
| Compar. Ex. 1 | 1.5 | 0.5 | 1 | Thomson die | 30 | 50 |
| Compar. Ex. 2 | 1.5 | 0.5 | 10 | Thomson die | 30 | 50 |
| Compar. Ex. 3 | 1.3 | 0.1 | 1 | Thomson die | 1 | 1 |
| Compar. Ex. 4 | 1.3 | 0.1 | 10 | Thomson die | 1 | 1 |
| Compar. Ex. 5 | 1.3 | 1.2 | 1 | Thomson die | 5 | 30 |
| Compar. Ex. 6 | 1.3 | 1.2 | 10 | Thomson die | 5 | 30 |
| Compar. Ex. 7 | 1.3 | 0.5 | 5 | Cutter | 12 | 30 |
| Compar. Ex. 8 | 0.6 | 0.4 | 10 | Water jet | 1 | 2 |
| Compar. Ex. 9 | 0.3 | 0.4 | 10 | Water jet | 1 | 1 |
| Compar. Ex. 10 | 0.2 | 0.4 | 10 | Water jet | 1 | 1 |
| Compar. Ex. 11 | 0.6 | 0.4 | 1 | Water jet | 1 | 2 |

What is claimed is:

1. A carbon crucible liner, comprising:
an upper wall portion;
a lower cup portion wherein the wall portion and the cup portion are formed from a single shaped flexible, high-purity expanded graphite sheet having a thickness of 0.2 to 1.0 mm, wherein the flexible high purity shaped graphite sheet has an impurity content not exceeding 5 ppm; and
a degree of flexibility such that a sample thereof, 10×100 mm in size, can withstand at least 10 times of bending in flexibility test comprising repeatedly bending the sample, with a 50 g weight suspended from one end thereof, by means of bending bodies with a diameter of 6 mm,
wherein the flexible, high-purity expanded graphite sheet has a bulk density of 0.7 to 1.3 g/cm$^3$.

2. The carbon crucible liner according to claim 1, wherein the flexible, high-purity expanded graphite sheet has a bulk density of 0.8 to 1.3 g/cm$^3$.

3. The carbon crucible liner according to claim 2, wherein the flexible, high-purity expanded graphite sheet has a thickness of 0.3 to 0.9 mm.

4. The carbon crucible liner according to claim 2, wherein the flexible, high-purity expanded graphite sheet has a thickness of 0.5 to 0.8 mm.

5. The carbon crucible liner according to claim 1, wherein the flexible, high-purity expanded graphite sheet has a bulk density of 0.9 to 1.3 g/cm$^3$.

6. The carbon crucible liner according to claim 5, wherein the flexible, high-purity expanded graphite sheet has a thickness of 0.3 to 0.9 mm.

7. The carbon crucible liner according to claim 5, wherein the flexible, high-purity expanded graphite sheet has a thickness of 0.5 to 0.8 mm.

8. The carbon crucible liner according to claim 1, wherein the flexible, high-purity expanded graphite sheet has a thickness of 0.3 to 0.9 mm.

9. The carbon crucible liner according to claim 1, wherein the flexible, high-purity expanded graphite sheet has a thickness of 0.5 to 0.8 mm.

10. In a Czochralski apparatus comprising a quartz crucible and a liner, the improvement comprising the carbon crucible liner according to claim 1 as said liner.

\* \* \* \* \*